(12) United States Patent
Mohan et al.

(10) Patent No.: US 8,962,383 B2
(45) Date of Patent: Feb. 24, 2015

(54) MULTI-NOZZLE ORGANIC VAPOR JET PRINTING

(71) Applicant: Universal Display Corporation, Ewing, NJ (US)

(72) Inventors: Siddarth Harikrishna Mohan, Plainsboro, NJ (US); Paul E. Burrows, Chattaroy, WA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/246,737

(22) Filed: Apr. 7, 2014

(65) Prior Publication Data

US 2014/0295615 A1    Oct. 2, 2014

Related U.S. Application Data

(63) Continuation of application No. 13/595,160, filed on Aug. 27, 2012, now Pat. No. 8,728,858.

(51) Int. Cl.
*H01L 51/40* (2006.01)
*H01L 51/00* (2006.01)
*H01L 51/56* (2006.01)

(52) U.S. Cl.
CPC .......... *H01L 51/0003* (2013.01); *H01L 51/56* (2013.01)
USPC ............. 438/99; 438/16; 438/29; 438/62; 118/300; 118/302; 118/315

(58) Field of Classification Search
None
See application file for complete search history.

(56) References Cited

U.S. PATENT DOCUMENTS

| | | |
|---|---|---|
| 4,325,986 A | 4/1982 | Baron et al. |
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |

(Continued)

FOREIGN PATENT DOCUMENTS

| | | |
|---|---|---|
| EP | 1238981 | 9/2002 |
| JP | 2010-135467 | 6/2010 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Kyoung Lee
(74) *Attorney, Agent, or Firm* — Morris & Kamlay LLP

(57) ABSTRACT

Systems and methods are provided for depositing thin patterned films of materials in which individual elements of the patterned film are deposited by two or more nozzles having different geometries. The different nozzle geometries may include one or more of different throttle diameters, different exhaust diameters, different cross-sectional shapes, different bore angles, different wall angles, different exhaust distances from the substrate, and different leading edges relative to the direction of movement of the nozzles or the substrate. Methods may include steps of ejecting a carrier gas and a material from a plurality of nozzles and depositing the material on a substrate in a plurality of laterally spaced elements.

20 Claims, 20 Drawing Sheets

(56) References Cited

U.S. PATENT DOCUMENTS

| | | | |
|---|---|---|---|
| 5,932,293 | A | 8/1999 | Belashchenko et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 7,194,197 | B1 | 3/2007 | Wendt et al. |
| 7,279,704 | B2 | 10/2007 | Walters et al. |
| 7,431,968 | B1 | 10/2008 | Shtein et al. |
| 7,744,957 | B2 | 6/2010 | Forrest et al. |
| 7,968,146 | B2 | 6/2011 | Wagner et al. |
| 2003/0230980 | A1 | 12/2003 | Forrest et al. |
| 2004/0174116 | A1 | 9/2004 | Lu et al. |
| 2010/0245479 | A1 | 9/2010 | Forrest et al. |
| 2010/0247766 | A1 | 9/2010 | Forrest et al. |
| 2011/0097495 | A1 | 4/2011 | Burrows et al. |
| 2011/0168092 | A1* | 7/2011 | Clark et al. .................. 118/641 |
| 2012/0024228 | A1 | 2/2012 | Lee |
| 2013/0026452 | A1 | 1/2013 | Kottas et al. |
| 2013/0119354 | A1 | 5/2013 | Ma et al. |

FOREIGN PATENT DOCUMENTS

| | | |
|---|---|---|
| WO | WO 2004/111066 | 12/2004 |
| WO | WO 2008/044723 | 4/2008 |
| WO | WO 2008/057394 | 5/2008 |
| WO | WO 2010/011390 | 1/2010 |
| WO | WO 2010/111175 | 9/2010 |

OTHER PUBLICATIONS

Baldo et al., "Very high-efficiency green organic light-emitting devices based on electrophosphorescence," Appl. Phys. Lett., vol. 75, No. 1, 4-6 (1999).

Arnold, Michael S. et al., "Direct vapor jet printing of three color segment organic light emitting devices for white light illumination," Applied Physics Letters, 92, 053301 (2008).

* cited by examiner

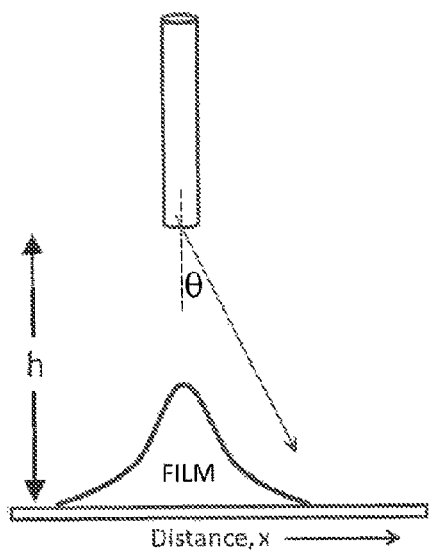
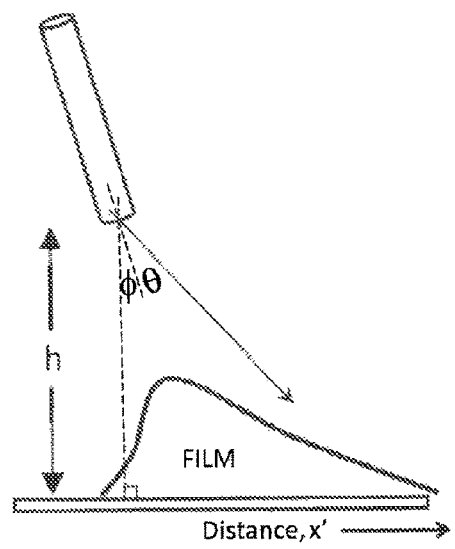
FIG. 14A
FIG. 14B

MULTI-NOZZLE ORGANIC VAPOR JET PRINTING

CROSS-REFERENCE TO RELATED APPLICATIONS

This application is a continuation of U.S. patent application Ser. No. 13/595,160, titled "Multi-Nozzle Organic Vapor Jet Printing," filed Aug. 27, 2012, which is hereby incorporated by reference in its entirety.

FIELD OF THE INVENTION

The present invention relates to the deposition of organic materials through a plurality of nozzles in which at least two of the nozzles include different geometries. The present subject matter may find particular applicability in the manufacture of opto-electronic devices, and the like, that make use of organic materials.

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entireties.

Organic vapor jet printing (OVJP) deposits a patterned organic thin film without the need for a shadow mask by transporting organic vapor in a carrier gas and ejecting it through a nozzle onto a substrate. The aim of OVJP has been to form an organic thin film pattern on the substrate that is substantially limited to the width of the nozzle. However, it is known that, with certain nozzle geometries, overspray may occur during OVJP. Overspray is defined as the percentage of the thickness of the deposited line that gets deposited on other parts of the substrate. For example, a three color display printed using OVJP might contain red, blue and green pixels that each require a separate material deposited from one or more nozzles. It is important that, for example, red light emitting material deposited from one nozzle does not stick to the same region of the substrate as blue light emitting material deposited from a different nozzle.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

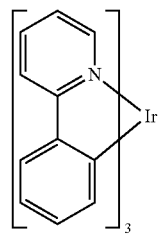

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

The present subject matter is generally directed to systems and methods for depositing patterned films of material. In particular, multiple nozzles having different geometries may be used to deposit a single element of a patterned film. Aspects of the invention have been found to be effective in improving the resolution of a patterned element, and/or reducing undesirable "overspray" that might otherwise increase the width of the patterned element.

According to first aspects of the invention, methods of depositing a thin film on a substrate may include one or more steps of ejecting a carrier gas and a material from a plurality of nozzles while moving the nozzles or the substrate relative to one another, wherein the material is deposited on the substrate from at least two of the nozzles, the at least two of the nozzles including different geometries.

In embodiments, the different geometries may include at least one of different throttle diameters, different exhaust diameters, different cross-sectional shapes, different bore angles, different wall angles, different exhaust distances (height) from the substrate, and different leading edges relative to the direction of movement of the nozzles or the substrate.

In embodiments, the at least two nozzles may include two or more relatively small nozzles and a relatively large nozzle. In embodiments, the relatively small nozzles may be disposed adjacent to the relatively large nozzle.

In embodiments where the at least two nozzles include different bore angles, with two or more relatively small nozzles and a relatively large nozzle, the relatively small nozzles may be angled to converge with respect to the relatively large nozzle.

In embodiments where the at least two nozzles include different exhaust distances from the substrate, e.g. with two or more relatively small nozzles and a relatively large nozzle, the relatively small nozzle(s) may be disposed closer to the substrate than the relatively large nozzle. Alternatively, the relatively small nozzle(s) may be disposed further from the substrate than the relatively large nozzle.

In embodiments, the exhaust distances of the at least two nozzles from the substrate may be, for example, approximately 300 Å different, or more.

In embodiments, the at least two of the nozzles may include a staggered arrangement relative to the direction of travel of the nozzles or substrate.

In embodiments, the at least two nozzles may include a relatively small nozzle and a relatively large nozzle, with the relatively small nozzle and relatively large nozzle being disposed in an arrangement that is not perpendicular or parallel to the direction of travel of the nozzles or substrate.

In embodiments, the carrier gas and material may be ejected from the at least two of the nozzles at different flow rates.

In embodiments, the at least two of the nozzles may be connected to different carrier gas sources.

In embodiments, the plurality of nozzles may be included in a nozzle block.

In embodiments, the material may be deposited by the at least two of the nozzles in an at least partially overlapping pattern.

In embodiments, the thin film may be deposited in a pattern including a plurality of laterally spaced elements, each of the elements deposited by a separate group of nozzles of the plurality of nozzles.

In embodiments, depositing the material from the at least two of the nozzles may provide a sharper edged pattern than would be achieved by depositing the pattern with a single nozzle.

According to further aspects of the invention, an apparatus for depositing a thin film of material on a substrate may be provided including a plurality of nozzles in fluid communication with a carrier gas and a material to be deposited, and a translation mechanism configured to move at least one of the substrate and the plurality of nozzles, relative to one another, during a deposition process. In embodiments, at least two of the nozzles may include different geometries.

In embodiments, the different geometries may include at least one of different throttle diameters, different exhaust diameters, different cross-sectional shapes, different bore angles, different wall angles, different exhaust distances from the substrate, and different leading edges relative to the direction of movement of the nozzles or the substrate.

In embodiments, the apparatus may include one or more organic material supplies, and one or more carrier gas supplies. In embodiments, the apparatus may be configured such that a vapor mixture of the carrier gas and the organic material may be passed through the plurality of nozzles, and the organic material deposited on a substrate after exiting the outlet.

In embodiments, the at least two nozzles may include two or more relatively small nozzles and a relatively large nozzle, the relatively small nozzles being disposed adjacent to the relatively large nozzle.

In embodiments where the at least two nozzles include different bore angles, e.g. with two or more relatively small nozzles and a relatively large nozzle, the relatively small nozzle(s) may be angled to converge with respect to the relatively large nozzle.

In embodiments where the at least two nozzles include different exhaust distances from the substrate, e.g. with two or more relatively small nozzles and a relatively large nozzle, the relatively small nozzle(s) may be disposed closer to the substrate than the relatively large nozzle. Alternatively, the relatively small nozzle(s) may be disposed further from the substrate than the relatively large nozzle.

In embodiments, the exhaust distances of the at least two nozzles from the substrate may be, for example, approximately 300 Å different, or more.

In embodiments, the at least two of the nozzles may include a staggered arrangement relative to the direction of travel of the nozzles or substrate.

In embodiments, the at least two nozzles may include a relatively small nozzle and a relatively large nozzle, with the relatively small nozzle and relatively large nozzle being disposed in an arrangement that is not perpendicular or parallel to the direction of travel of the nozzles or substrate.

In embodiments, the apparatus may be configured such that the carrier gas and the material are ejected from the at least two of the nozzles at different flow rates.

In embodiments, the at least two of the nozzles may be connected to different carrier gas sources.

In embodiments, the plurality of nozzles may be included in a nozzle block. In embodiments, each of the plurality of nozzles may be configured to deposit an organic emitting material. In embodiments, at least three different organic material supplies containing different organic emitting materials may be connected to different groups of nozzles.

In embodiments, the at least two of the nozzles may be arranged such that the material is deposited from the at least two of the nozzles in an at least partially overlapping pattern.

In embodiments, the plurality of nozzles may be arranged in a line.

In embodiments, the plurality of nozzles may be arranged in a two dimensional array.

In embodiments, the apparatus may be configured such that the thin film is deposited in a pattern including a plurality of laterally spaced elements, each of the elements deposited by a separate group of nozzles of the plurality of nozzles.

According to yet further aspects of the invention, methods of depositing a thin film on a substrate may include one or more steps of ejecting a carrier gas and a material from a plurality of nozzles while moving the nozzles or the substrate relative to one another, and depositing the material on the substrate in a pattern including a plurality of laterally spaced elements, each of the elements deposited by a separate group of nozzles of the plurality of nozzles. In embodiments, at least one of the laterally spaced elements includes a first width, and at least one of the nozzles in the group of nozzles depositing the at least one of the laterally spaced elements is configured to deposit the material on the substrate in a second width that is smaller than the first width.

In embodiments, at least two nozzles in a single group of nozzles may have different deposition widths.

In embodiments, at least two nozzles in a single group of nozzles may have substantially equal deposition widths.

In embodiments, at least two nozzles in a single group of nozzles may have different deposition widths, and at least two nozzles in the single group of nozzles may have substantially equal deposition widths.

In embodiments, the material may be deposited without the use of a shadow mask.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification; illustrate embodiments of the invention and together with the detailed description serve to explain the principles of the invention. No attempt is made to show structural details of the invention in more detail than may be necessary for a fundamental understanding of the invention and various ways in which it may be practiced.

FIGS. 14A and 14B are schematic illustrations showing a comparison of nozzles with different angles, illustrating a model used to calculate the peak shift and asymmetry induced by tilting the nozzle away from normal to the substrate.

DETAILED DESCRIPTION

Figure 1:
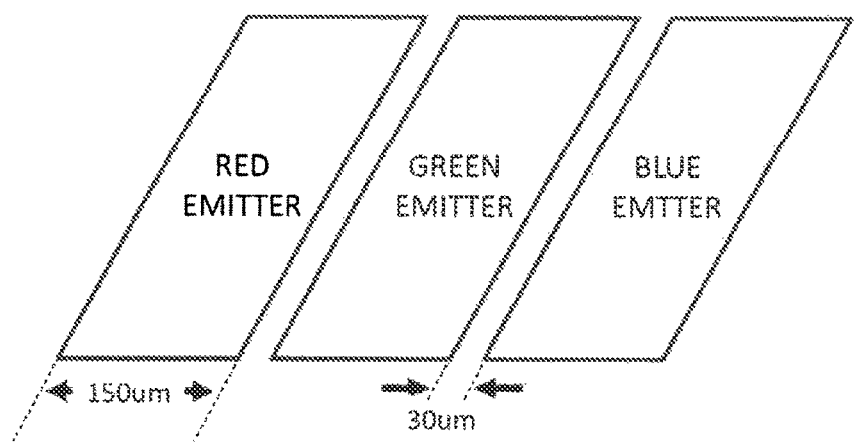
FIG. 1 is a subpixel structure of a hypothetical high resolution large screen television, illustrating the challenge of uniformly coating the red pixel without contaminating the green or blue pixels.

It is understood that the invention is not limited to the particular embodiments described herein, as these may vary as the skilled artisan will recognize. It is also to be understood that the terminology used herein is used for the purpose of describing particular embodiments only, and is not intended to limit the scope of the invention. It also is to be noted that as used herein and in the appended claims, the singular forms "a," "an," and "the" include the plural reference unless the context clearly dictates otherwise. Thus, for example, a reference to "a nozzle" is a reference to one or more nozzles and equivalents thereof known to those skilled in the art.

Unless defined otherwise, all technical terms used herein have the same meanings as commonly understood by one of ordinary skill in the art to which the invention pertains. The embodiments of the invention and the various features and advantageous details thereof are explained more fully with reference to the non-limiting embodiments and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein.

Any numerical values recited herein include all values from the lower value to the upper value in increments of one unit provided that there is a separation of at least two units between any lower value and any higher value. As an example, if it is stated that the concentration of a component or value of a process variable such as, for example, size, angle size, pressure, time and the like, is, for example, from 1 to 100, from 1 to 50, or from 5 to 20, it is intended that values included therein are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

As used herein, a "radius" of variously described inlets, outlets, and other nozzle portions is not limited to circular cross sections, and may be broadly understood to include a segment extending from the geometric center, or centroid, of the local cross section to a point on the perimeter of the cross section. Particular radii may be further specified to be, for example, a maximum or minimum radius of the cross sectional shape.

As used herein, a "diameter" of variously described inlets, outlets, and other nozzle portions is not limited to circular cross sections, and may be broadly understood to include a segment passing through the geometric center, or centroid, of the local cross section, including, for example, spanning distances of circular and non-circular shapes. The use of diameter may be further specified to be, for example, a maximum or minimum diameter of the cross sectional shape.

As used herein, "exhaust distance" (sometimes known as nozzle height) typically refers to the distance between the nozzle exhaust and the substrate, as measured perpendicularly from the substrate. This would normally be measured from the center of the nozzle exhaust, but, in certain circumstances, may also be measured from an edge of the exhaust that is closest to the substrate.

A typical OLED device comprises a stack of thin films with various functions such as anode, organic charge transport layers, organic light emitting layers and cathode. At least one of these layers must be laterally patterned in almost all functional devices. For a multicolor device such as a display, the organic emissive layer itself must be patterned. In other devices such as a lamp, patterning of red, blue and green emissive layers is required to generate overall high quality white light. On occasion, it is may also be beneficial to pattern the charge transport, or other layers. For applications such as high resolution displays, different organic thin film compositions must be laterally patterned into lines or pixels with very little dark space between the pixels. The light emitting area of a lamp or display as a fraction of its total area is known as the aperture ratio, and it is almost always desirable to maximize the aperture ratio by minimizing the dark space in between the sub-pixels. To achieve this, for example, in a high resolution large area television might require the patterning of 150 μm sub-pixels with only 30 μm of dark space in between them, as illustrated in FIG. 1. Small displays may require even higher resolution patterning.

There is, therefore, a need for a manufacturable method to deposit laterally-patterned OLEDs on a substrate with not only EML layers of different composition (e.g. R, G, B emitters) but also charge transport or inert layers of different thickness. The term "manufacturable" is meant to imply a low-cost and high throughput process. A TAC time of, at most, two minutes is desirable for manufacturing large, high resolution displays.

Figure 2:
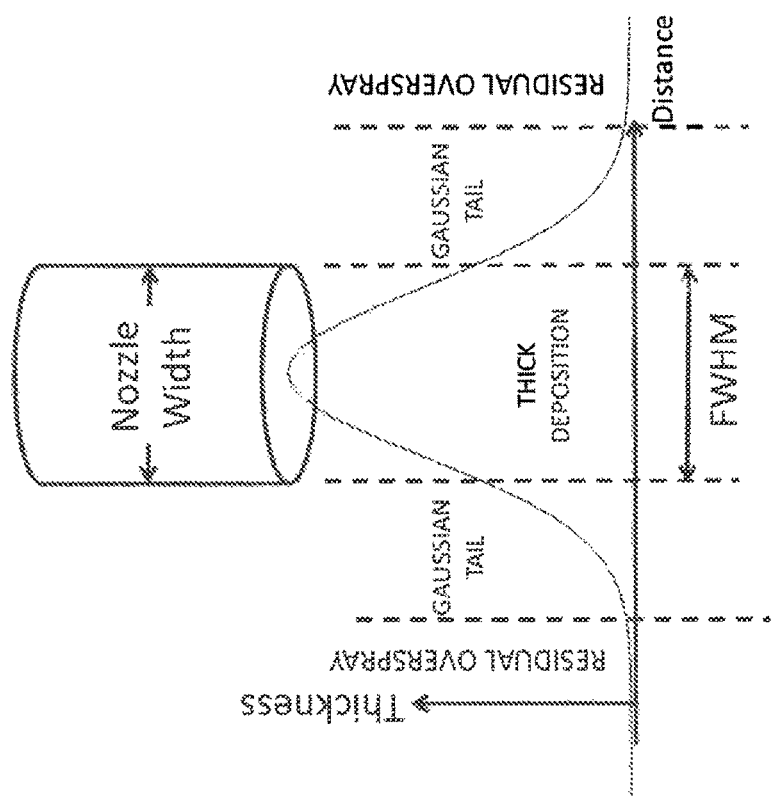
FIG. 2 is model of thin film deposition from a nozzle, including the Gaussian tail and unintentional overspray from a simple, cylindrical nozzle.

OVJP can be used to pattern such lines and pixels without the use of shadow masks by ejecting organic vapor from a nozzle onto a substrate. See, e.g. U.S. Pat. No. 7,431,968. For a small, cylindrical nozzle, the resulting thin film may be modeled as having a Gaussian profile, or a similar bell shaped profile depending on the exact nozzle shape and distance from the substrate. That is to say, while the full width at half maximum (FWHM) of the deposited film may be related to the diameter of the nozzle, there is significant deposition of thin film at some lateral distance from the nozzle as illustrated in FIG. 2. Even under ideal conditions, some film deposition may fall outside the diameter of the nozzle, in the area labeled "Gaussian Tail" in FIG. 2. Note that the Gaussian distribution is merely a model for the deposition shape that is not supposed to be limiting for this invention, and the exact shape of the "Gaussian tail" may depend on the nozzle shape, temperature and carrier gas flow rates as well as the proximity of the nozzle to the substrate. The existence of this deposition tail has been documented in the literature, for example "Direct vapor jet printing of three color segment organic light emitting devices for white light illumination" by Michael S. Arnold, et al. published in Applied Physics Letters 92, 053301 (2008).

As used herein, OVJP should be understood as a deposition process that typically includes the steps of 1) heating an organic material in a crucible, causing it to evaporate, 2) passing an inert carrier gas such as nitrogen over the hot organic material, thereby entraining organic vapor within the carrier gas, and 3) flowing the carrier gas with the organic vapor down a tube, where it is ejected onto a substrate via a nozzle to form a thin, laterally patterned organic film. In embodiments, the substrate may be cooled to assist with the deposition of the film.

Embodiments of OVJP generally involve a "jet" of gas ejected from the nozzle, as distinct from other techniques, such as OVPD (organic vapor phase deposition), where a carrier gas may be used, but there is no "jet." A "jet" occurs when the flow velocity through the nozzle is sufficiently large to result in a significantly anisotropic velocity distribution relative to the isotropic velocity distribution of the molecules in a stagnant gas. One way of defining when a jet occurs is when the flow velocity of the carrier gas is at least 10% of the thermal velocity of the carrier gas molecules.

One unique aspect of OVJP is that the organic species may be accelerated by the flow of a much lighter carrier gas to hyperthermal velocities. This can lead to denser and more ordered thin films, which potentially broadens the processing window for ultra-rapid growth of high quality thin films for device applications. This acceleration may also allow the instantaneous local deposition rate of OVJP to exceed that of the alternative broad-area deposition methods, resulting in an advantage in the rapid printing of large-scale electronics.

Because OVJP does not use liquid solvents, it may allow for greater latitude in the choice of substrate material and shape than other processes such as ink jet printing, thereby permitting a wider variety of organic semiconductors and structures to be deposited. The molecules used for organic devices typically have vapor pressures of up to several millibar, allowing high practical deposition rates. OVJP is preferably used to deposit small molecule organic materials because they generally have sufficient vapor pressure at reasonable temperatures to allow for a high deposition rate. However, OVJP may have applications to other materials, such as polymers.

Figure 3:
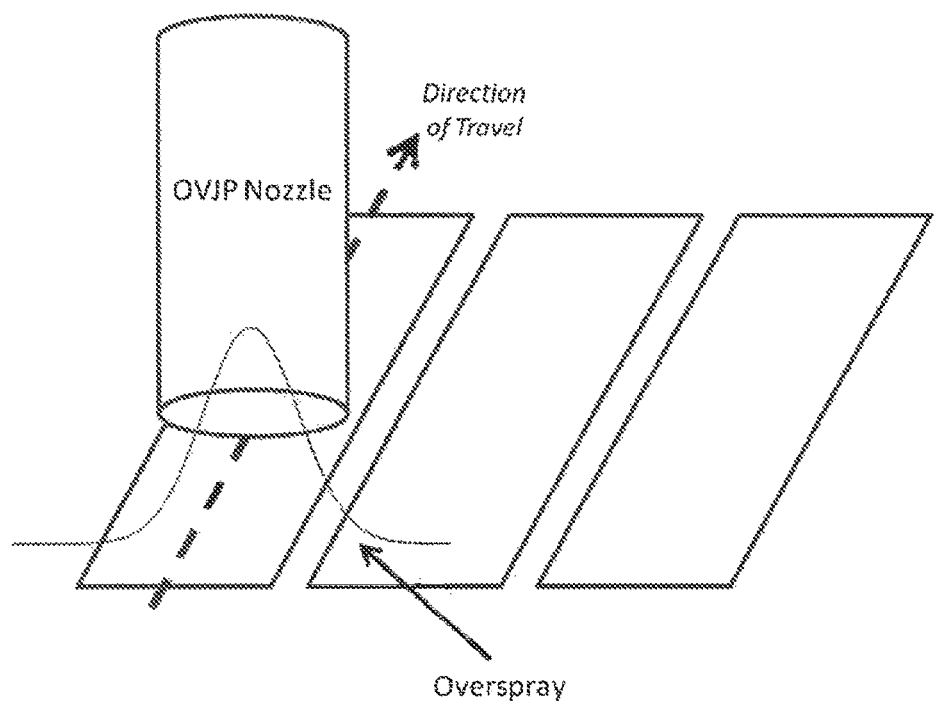
FIG. 3 shows a related art method of coating an organic thin film on a contact pad, showing contamination due to the Gaussian tail of the thin film profile.
Figure 4A:
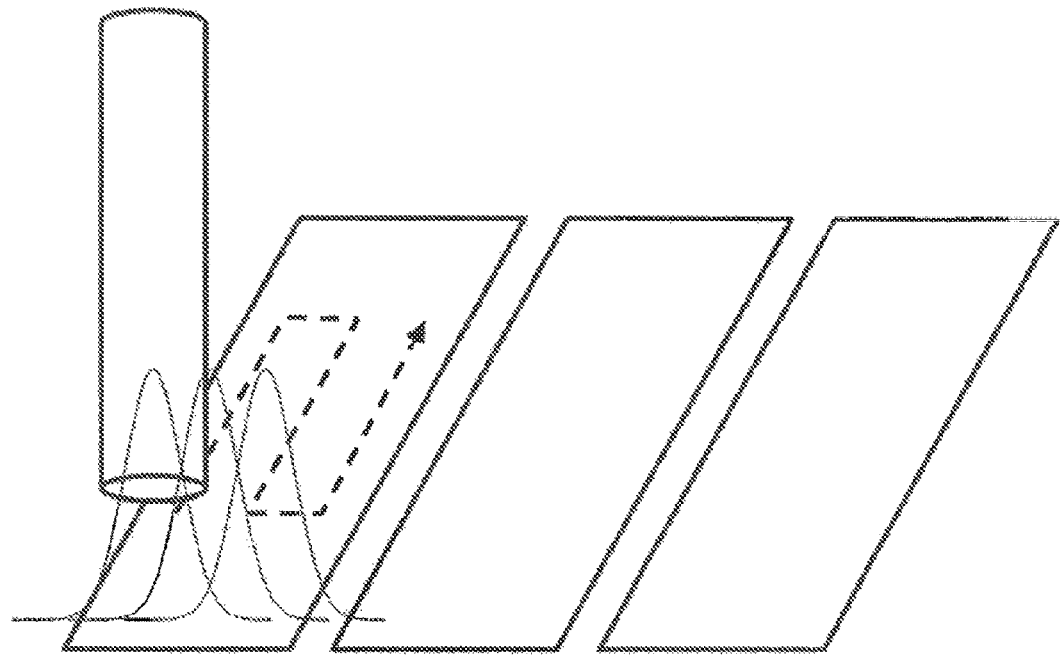
FIG. 4A shows a related solution to the Gaussian tail problem using a nozzle with a much smaller diameter than the contact pad to build up a uniform thin film over the entire contact pad.
Figure 4B:
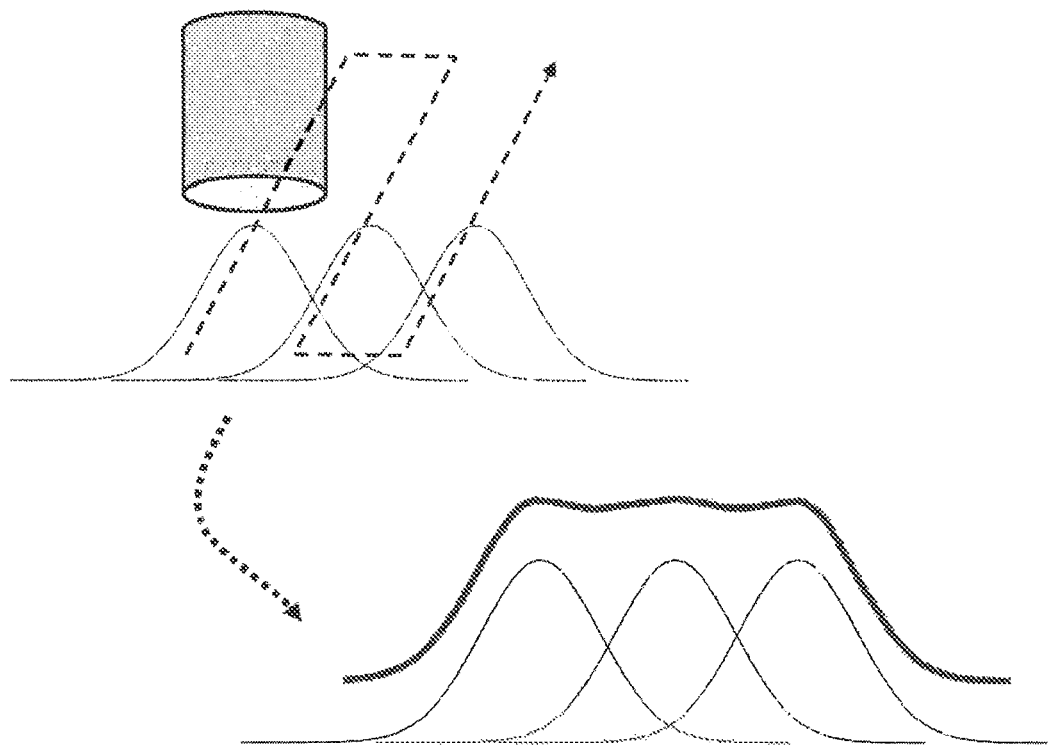
FIG. 4B is a schematic illustration of how multiple passes of a nozzle with small offsets between each pass can build up a uniform thin film but cannot produce an edge profile any sharper than the profile of an individual pass.

A problem sometimes associated with OVJP patterning of high resolution displays is therefore illustrated in FIGS. 3 and 4. In FIG. 3, a cylindrical OVJP nozzle with a diameter roughly equal to the width of a display pixel is used to deposit an organic thin film. However, because of the Gaussian tail of the thickness distribution, a small amount of material inevitably gets deposited on the adjacent sub-pixel. This is particularly undesirable when the emitter material is being deposited, for example, as a very small amount of red light emitting material inadvertently deposited on the blue or green subpixel will result in substantial quenching of the light output due to Forster or Dexter transfer to the lower energy dopant. Other patterning challenges may be similarly affected, such as contaminating the p-layer of a p-n photovoltaic junction with n-type material during the printing of solar cells. One potential solution to this problem is shown in FIGS. 4A and 4B, where a nozzle with a diameter much smaller than the width of the sub-pixel is used to deposit the organic thin film. By using a smaller nozzle, a much sharper edge on the thickness profile is achievable, so that the edge of the subpixel may be covered with thin film without contaminating the adjacent subpixel. In this case, however, multiple passes of the nozzle over the substrate, with a small lateral offset before each pass, would be required in order to cover the sub-pixel with a substantially uniform thin film. The offset would have to be significantly less than the width of the nozzle in order to produce a sufficiently uniform thin film for OLED applications, or other devices with an extreme sensitivity to organic thin film thickness. For example, a nozzle with a diameter one fifth that of the subpixel might require 10-20 passes to produce an acceptably uniform thin film.

FIG. 4B schematically illustrates what the result of attempting the above solution would be, where a nozzle is scanned three times over an area with a small lateral offset between each scan. By adjusting the size of the lateral offset, it might be possible to produce a patterned thin film with a cross-sectional profile that is almost flat on top (FIG. 4B, bottom). However, the slope of the pattern edge, or its sharpness, would be limited by the slope of the Gaussian tail from the nozzle and can be no sharper than this.

Figure 5:
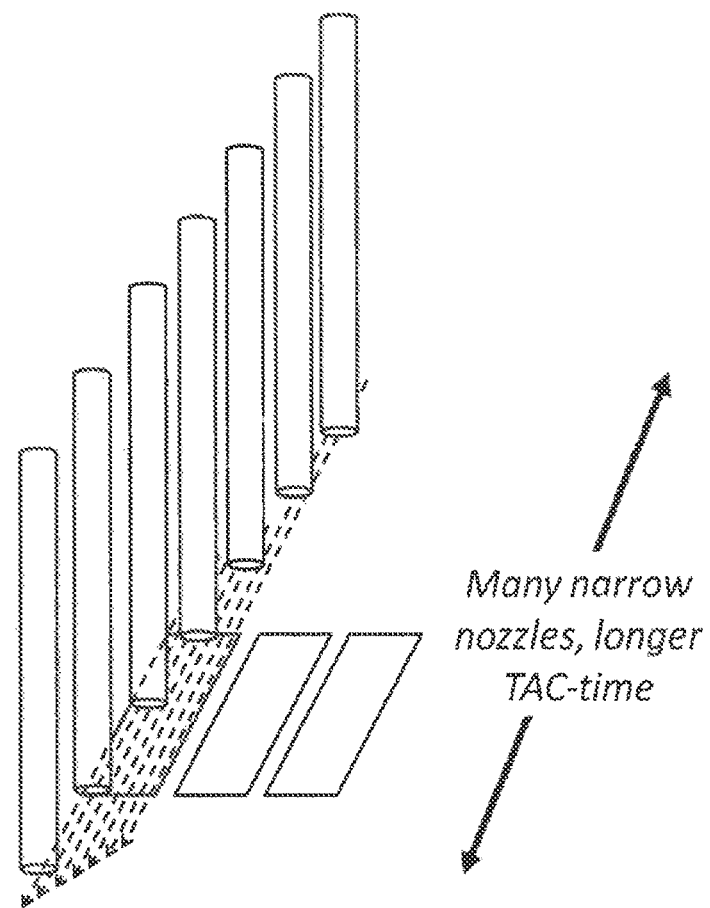
FIG. 5 shows an array of smaller nozzles that could be used to print a line with a flat top and sharp sides.

Alternatively, a linear array of closely spaced similar sized nozzles (spacing much lesser than the width/diameter of the nozzle) might be used to enable printing in a single pass. This however will lead to jet interactions between the adjacent spaced nozzles, thereby affecting the uniformity of the film. A 2-D array/staggering of similar sized nozzles with increased spacing can prevent these jet interactions if the nozzles are sufficiently spaced out; but this technique still results in a longer TAC time as shown in FIG. 5. TAC time dramatically increases, e.g. to the point where economical manufacture is impossible.

According to aspects of the invention, systems and methods are provided in which multiple nozzles may be used to overcome these problems, enabling the deposition of, for example, an organic thin film patterned by OVJP with sharp edges in a single pass of the nozzle array.

Figure 6:
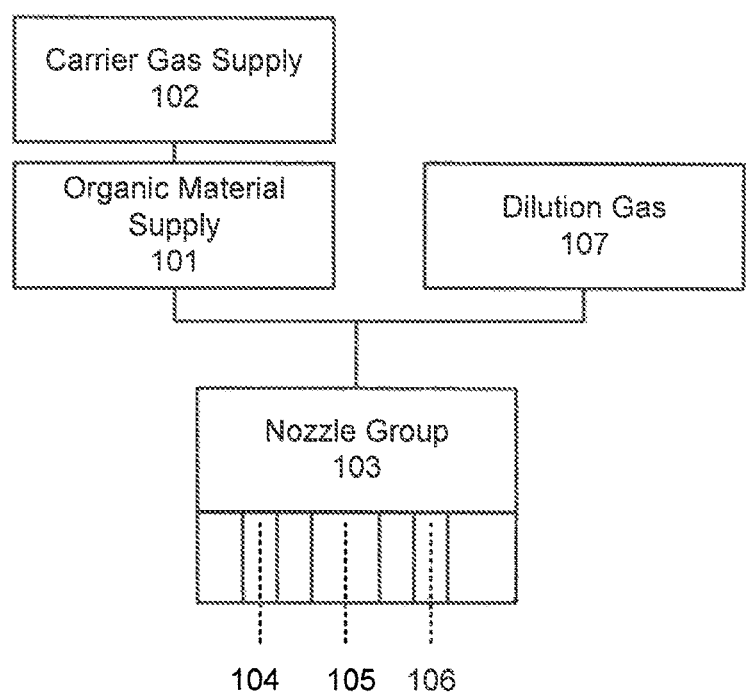
FIG. 6 is a schematic illustration of an exemplary deposition system according to aspects of the invention.

In the present subject matter, a nozzle configuration may be implemented to, for example, improve resolution and/or reduce overspray of a deposited material. As schematically shown in FIG. 6, an exemplary organic material depositing device may generally include one or more organic material supplies 101, one or more carrier gas supplies 102, and a nozzle group 103, or other nozzle structure, including a plurality of nozzles 104-106 in fluid communication with the organic material supply and the carrier gas supply. A dilution gas 107 may also optionally be provided. The specifics of such connections, and the related architecture, may vary as known by those of skill in the art and are not described in detail here.

As used herein a "group" of nozzles may be understood as two or more nozzles that are configured to deposit a patterned element that is typically laterally separated from other elements. In embodiments, the plurality of nozzles 104-106 may be configured to deposit, for example, an organic emitting material, or other materials described herein and known to those of skill in the art. At least two of nozzles 104-106 may have different geometries, which, as described further herein, may include one or more of different throttle diameters, different exhaust diameters, different cross-sectional shapes, different bore angles, different wall angles, different exhaust distances from the substrate, and different leading edges relative to the direction of movement of the nozzles or the substrate. For example, nozzles 104 and 106 may have different throttle diameters, different exhaust diameters, different cross-sectional shapes, different bore angles, different wall angles, different exhaust distances from the substrate, and/or different leading edges relative to the direction of movement of the nozzles or the substrate, compared to nozzle 105.

Nozzle group 103 may be combined in a nozzle block, or other structure, with additional nozzles and/or groups of nozzles, which may, for example, be connected with different organic material supplies 101 containing different organic emitting materials. This type of arrangement may be preferable, for example, in forming displays or lighting panels with different color emitting pixels or regions. However, it may also be desirable to limit the nozzle groups to the same material to be deposited, e.g. a first organic material, so that a plurality of lines of the first material can be deposited in unison under certain conditions. After that, a second group of nozzles may be used to deposit a different material under different conditions.

Nozzle group 103 may be included in a nozzle block, or other structure, including the plurality of nozzles arranged in a line and/or in a two dimensional array. In embodiments, the nozzle(s) may be included in a print head. The print head may have a thickness in a range of, for example, 5 mm to 25 mm.

The print head may comprise a plurality of first nozzles in fluid communication with a first source of gas, a plurality of second nozzles in fluid communication with a second source of gas, and/or a plurality of third nozzles in fluid communication with a third source of gas.

The nozzle(s) included in nozzle group 103 may be formed from a variety of materials, such as, for example, silicon, metals, ceramics and combinations thereof. In embodiments, the inlet, outlet and/or portion of the nozzle may be manufactured from a layer of material different from each other.

A source, such as the organic material supply 101, may include multiple organic sources. Multiple vias connected to different gas sources may be in fluid communication with the same nozzle, resulting in a mix of gases in the nozzle. Further details regarding an exemplary use of multiple nozzle groups are described with reference to FIG. 7.

Figure 7:
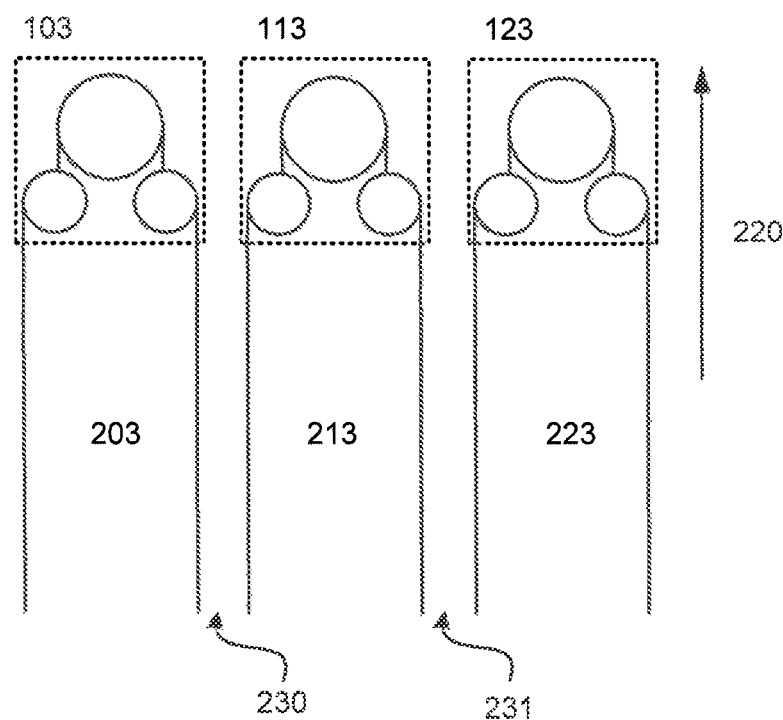
FIG. 7 is a schematic illustration of another exemplary deposition system including multiple groups of nozzles, showing separate deposition patterns, according to aspects of the invention.

As shown in the schematic top-down view of FIG. 7, a plurality of nozzle groups 103, 113, and 123 may each include a plurality of nozzles (in this case three each). Each of the nozzle groups 103, 113, 123 may be configured to deposit the same, or different, materials. The nozzle groups 103, 113, 123 may be moved in direction 220 and/or the underlying substrate may be moved in the opposite direction. In embodiments, the nozzle groups 103, 113, 123 may be configured to move together, such as part of a nozzle block assembly, or may be moved independently, such as when separately depositing different organic materials under different conditions.

As the nozzles are moved relative to the substrate, laterally separated patterns of material 203, 213, and 223 may be formed on the substrate via OVJP of the material through the nozzles. Thus, as can be seen in FIG. 7, each group of nozzles forms a discreet patterned element, separated by gaps 230 and 231 with substantially no film deposition. The dimensions of gaps, such as 230 and 231, may depend on a number of factors including the type of device that is being manufactured. For example, for a large area HDTV, which may have a pixel configuration such as shown in FIG. 1, 150 μm subpixels may be spaced apart by 30 μm gaps. Dimensions of this size have been shown to be compatible with OVJP, and may be implemented according to aspects of the present invention. In contrast, smaller devices, such as a head-mounted microdisplay, might have significantly smaller subpixels, e.g. approximately 5 μm, with a correspondingly small space in between (e.g. approximately 1 μm or less). In embodiments, the diameter(s), and/or deposition width, of at least one nozzle in a nozzle group may be less than the desired spacing between the patterned areas, e.g. a diameter equal to 0.1-0.99 of the desired spacing, 0.1-0.5 of the desired spacing, or other appropriate dimensions depending on processing parameters.

It should be noted that, although the embodiment shown in FIG. 7 includes apparently differently sized nozzles, with different leading edges in the direction of travel, for ease of depiction, the invention is not limited only to differently sized nozzles, and, therefore, the schematically shown nozzles 104, 105 and 106, and nozzle groups 103, 113 and 123, may represent any of the different combinations of geometries discussed herein. Further details regarding exemplary configurations and deposition patterns are discussed below.

Figure 8:
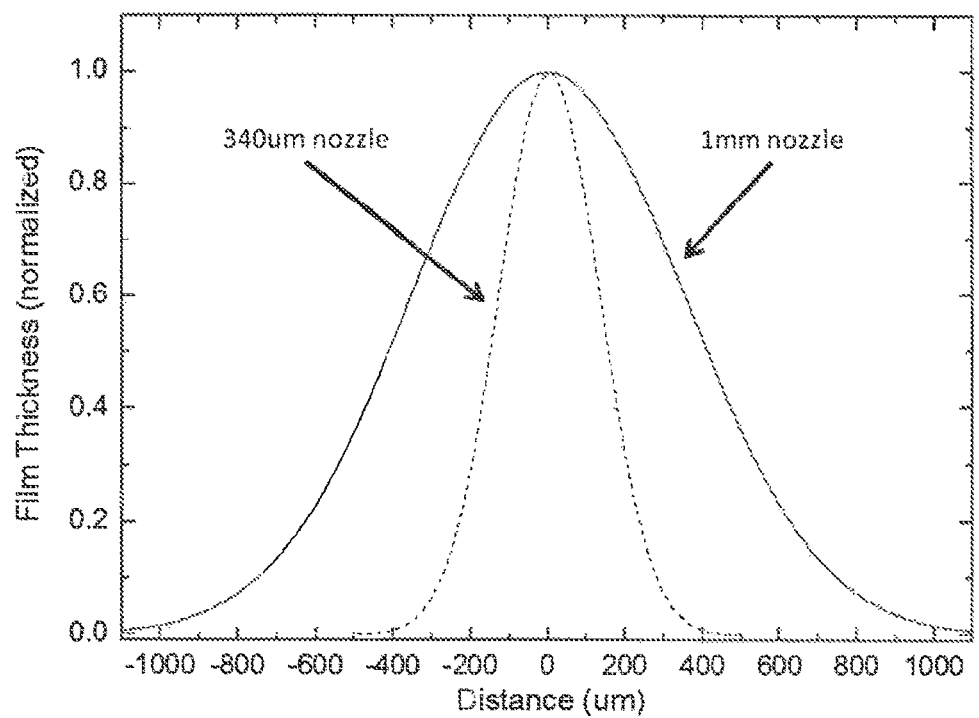
FIG. 8 is a Gaussian fit to actual experimental data from lines deposited from a 1 mm nozzle and a 340 μm nozzle, showing that the smaller nozzle gives a narrower and sharper line profile.

In their experimental work, the inventors have studied the patterned thin films produced by ejecting organic vapor through, for example, circular nozzles of diameter 1.0 mm and 0.34 mm. These profiles have been measured and fit to Gaussian functions and are shown in FIG. 8. The profile from the 0.34 mm diameter nozzle is significantly sharper than the profile from the 1.0 mm diameter nozzle. Note that, to generate these results, each nozzle was scanned about one nozzle diameter above the substrate. That is to say, the 1.0 mm nozzle was scanned 1.0 mm above the substrate and the 340 μm nozzle is scanned about 340 μm from the substrate.

Figure 9:
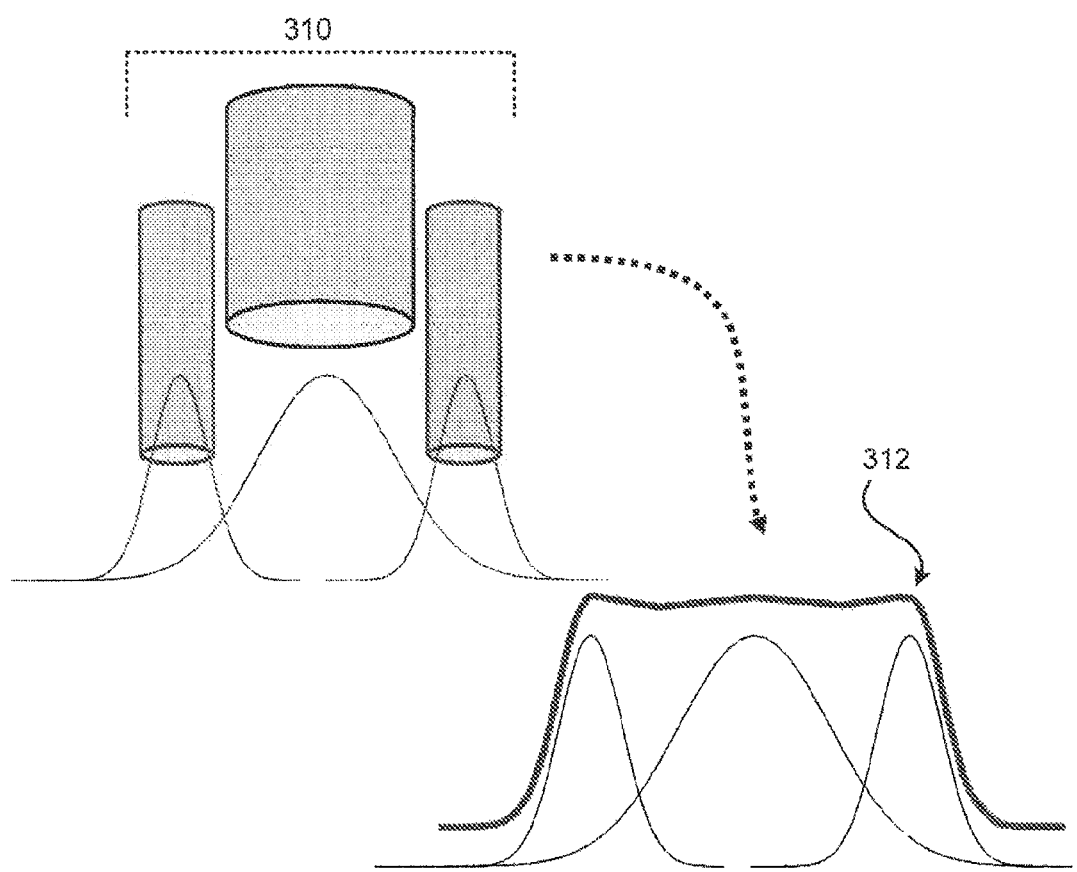
FIG. 9 is a schematic illustration of an embodiment of the invention including nozzles with different geometries and a resulting deposition profile.

FIG. 9 shows an embodiment of the invention including a group of nozzles 310. Here, two 300 μm nozzles are spaced laterally from a 1.0 mm nozzle. The profile of the thin film cross section produced by each nozzle is shown beneath the nozzles. FIG. 9 also schematically shows what the sum of these profiles on the substrate looks like. By summing the profiles from, in this case, a wide nozzle and two narrower nozzles spaced as shown in FIG. 9, a composite profile 312 with a flatter top and sharper sides than a single nozzle can produce in a single pass.

In the embodiment shown in FIG. 9, the smaller nozzles are disposed such that the exhaust/outlets of the nozzles are closer to the substrate than that of the larger nozzle. However, in other embodiments, the exhaust/outlets of the smaller nozzles (or nozzles with different geometry) may be even with, or further from the substrate, than the larger/central nozzle. In embodiments where at least two of the nozzles include different exhaust distances from the substrate, the different exhaust distances may be, for example, approximately 300 Å different, or more.

Figure 10:
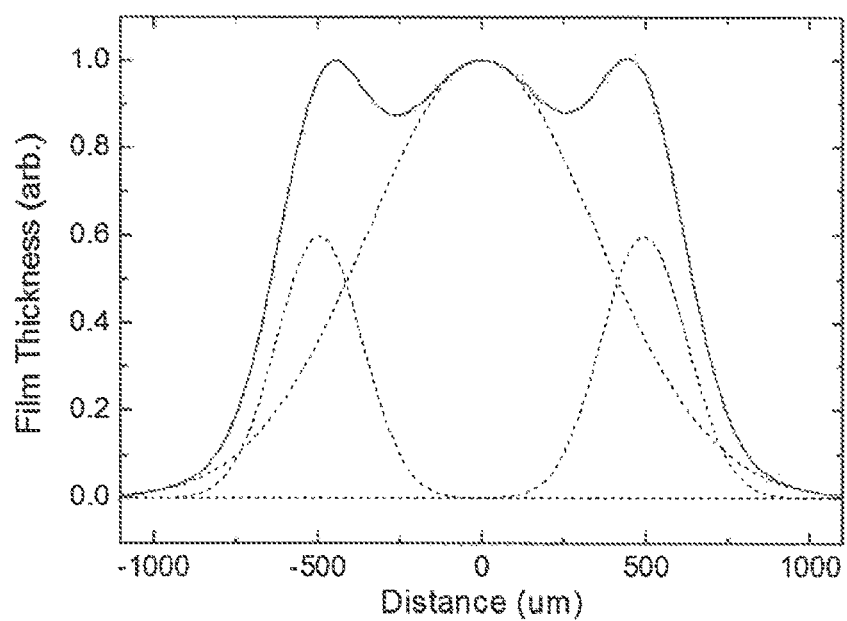
FIG. 10 is a model of the summed line profile due to a 1 mm nozzle and two 340 μm nozzles all pointed directly at a substrate at normal incidence.

FIG. 10 shows experimental data to illustrate this embodiment. The data shown are the Gaussian fits to line profiles deposited in an experimental OVJP system and measured using a stylus profilometer. The principal 1.0 mm nozzle is defined to be at position x=0, and two 340 μm nozzles are defined at positions −500 μm and +500 μm from the centerline of the larger nozzle. It is noted that, this model only represents one variation, whereas other embodiments described further below can be achieve similar results, e.g. even if each nozzle has a finite wall thickness. Also, in model shown in FIG. 10, each nozzle is scanned at a preferable height of about one nozzle diameter, but this should not be taken as restricting the scope of the invention. To obtain the data in FIG. 10, the 340 μm nozzles are operated with a carrier gas flow and temperature combination so as to give a deposit only 60% as thick at its peak as that from the 1.0 mm nozzle.

If a flatter profile top is required for a particular device application, as it may be for OLEDs, this may be achieved in various ways, for example, by adding more nozzles to fill in the troughs, or by running two sets of nozzles offset by one peak-to-trough distance, or by using two passes of a single set of nozzles with the second pass being offset from the first by one peak to trough distance. Any of these methods would yield a faster TAC time than could be obtained using multiple passes of the narrow nozzle alone.

Figure 11:
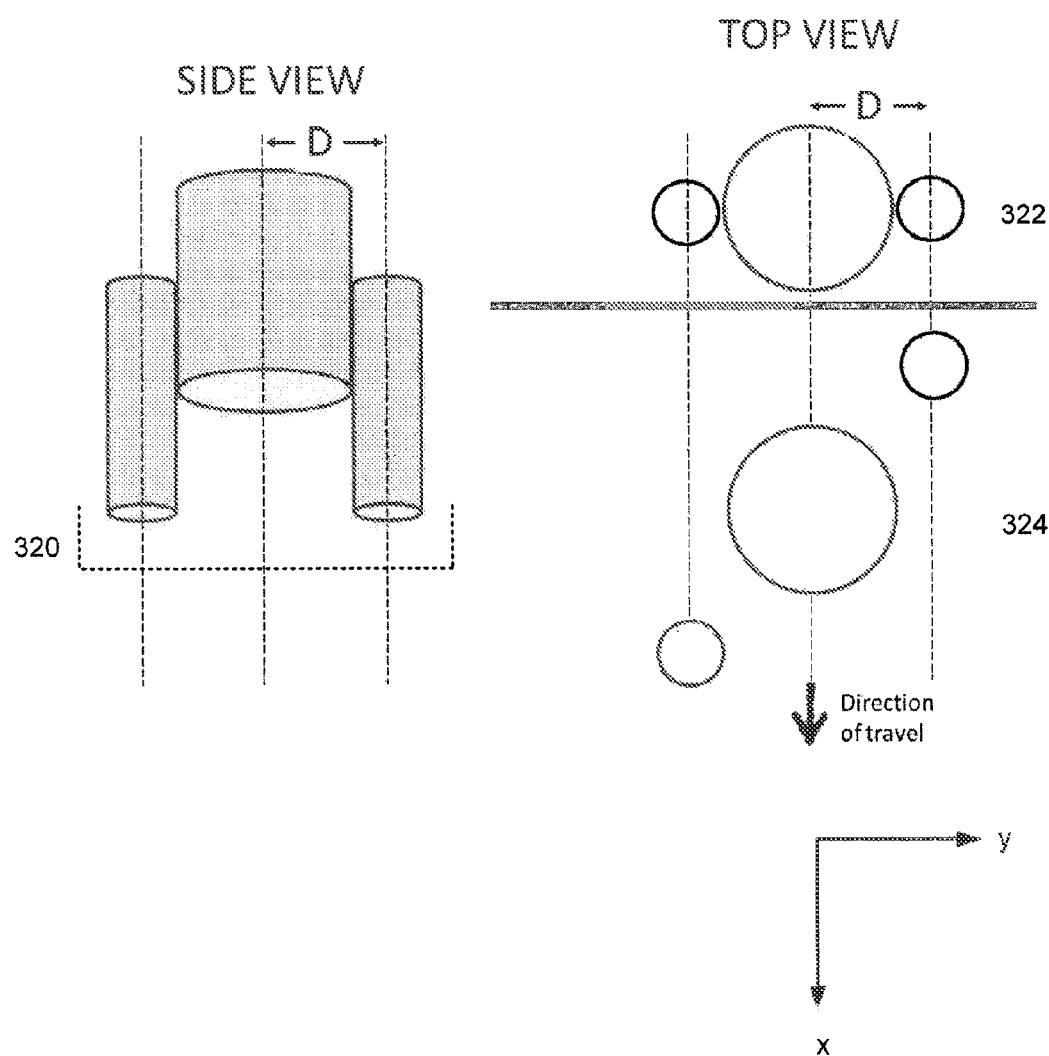
FIG. 11 is a side view and top view of exemplary three nozzle arrangements according to further aspects of the invention.
Figure 12:
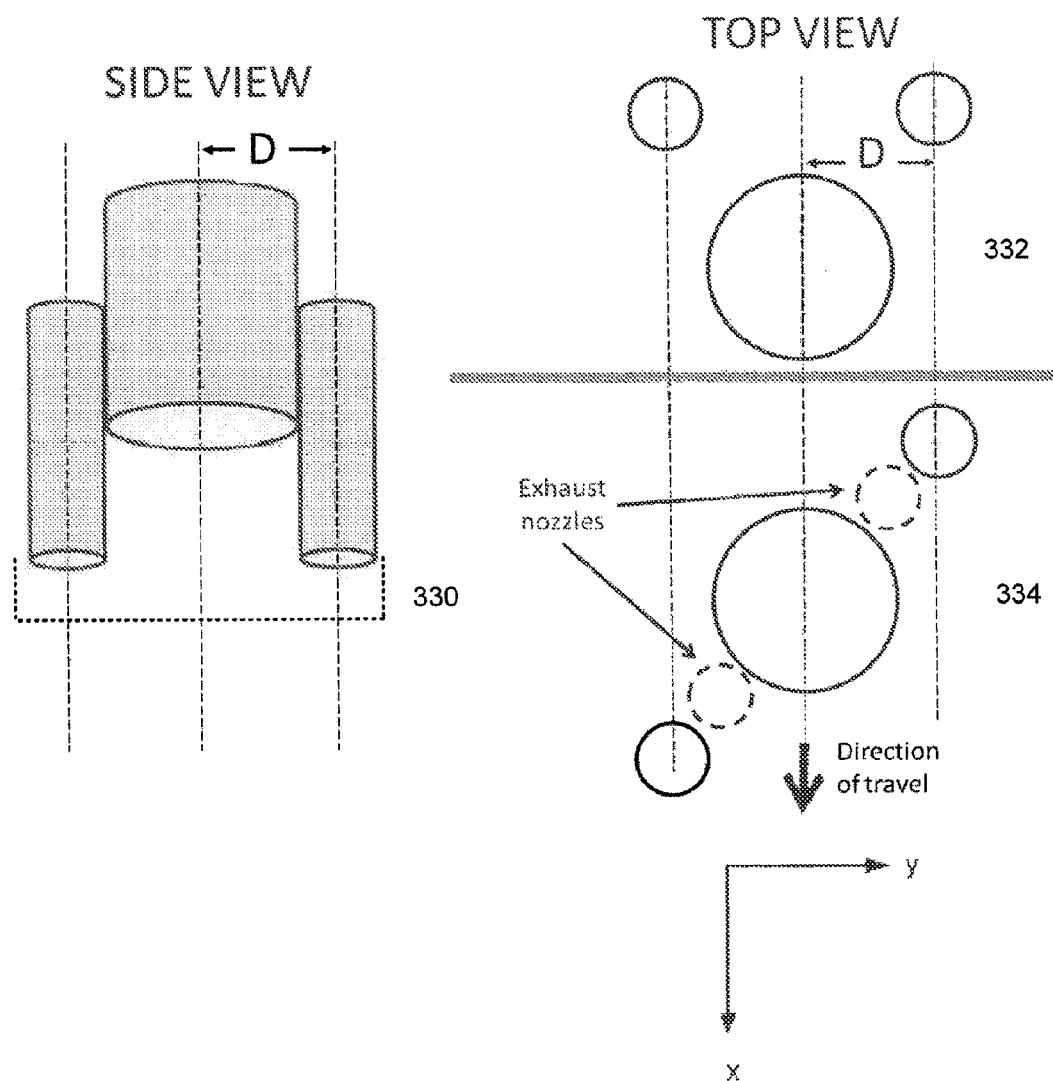
FIG. 12 shows additional embodiments of exemplary three nozzle arrangements according to further aspects of the invention.

FIGS. 11 and 12 show a series of potential implementations of the multi-nozzle design. In FIG. 11, a group of nozzles 320 is shown with a close effective lateral spacing of the three nozzles, which can be achieved even if the nozzles are relatively far apart. For example, arranging such nozzles closely as in arrangement 322 might be difficult based on nozzle wall thickness, or other factors, and may also cause certain problems with deposition, such as interference between the jets and overspray. Thus, one close nozzle arrangement in the y-direction may be accomplished by staggering the nozzles in the x-direction, the nozzle group being moveable (relatively) in the x-direction or the y-direction, as shown in nozzle arrangement 324. It should be noted that, if the outer nozzles are equally spaced and staggered, this may also allow for relative movement of the nozzle group 320 in both of the x-direction and the y-direction with relatively similar results. This arrangement may be referred to as "staggered geometry." This might be a preferred embodiment if, example, the smaller nozzles are required to be closer to the substrate than the larger nozzles because, in that case, there might be problems with the smaller nozzles casting a shadow on the deposition from the large nozzle. The staggered geometry also permits the three nozzles to be effectively closer perpendicular to the direction of travel than would otherwise be achievable because of the nozzle size and finite wall thickness.

FIG. 12 shows other possible embodiments of a three nozzle-nozzle group 330, including arrangement 332, in which both auxiliary nozzles are arranged in line behind the primary nozzle, and arrangement 334 which includes exhaust ports between the primary and auxiliary nozzles. One advantage of a staggered arrangement can thus be seen in arrangement 334 as it allows for an exhaust port to be placed in between the nozzles, which may mitigate the build of up carrier gas pressure between the nozzles. An exhaust port may be connected to a negative pressure, or suction, pump, or to a space with lower ambient pressure than the deposition chamber, and is not to be confused with the exhaust of a depositing nozzle, which is connected to a material source and a carrier gas source.

Furthermore, a staggered geometry may better enable the use of a chiller plate, which may be incorporated in the nozzle group housing or nozzle block, by providing additional surface area between the nozzles of a nozzle group. Further details regarding the configurations and implementations of chiller plates for OVJP deposition are described in U.S. Pat. Pub. 2011/0097495, the contents of which are incorporated herein by reference. Thus, in embodiments, a chiller plate may be included in areas of a nozzle group housing or nozzle block that are between nozzle exhausts as described herein.

It should also be noted that the arrangement 332 can be reversed such that the auxiliary nozzles precede the primary nozzle in the direction of travel. This may be beneficial, for example, in depositing a trough in which the overspray of the primary nozzle is constrained. Additionally, although the embodiments shown in FIGS. 9, 11 and 12 include a single primary nozzle, the invention is not limited to only one such nozzle. For example, a plurality of primary nozzles having the same, or different, geometries may be arranged with one or more auxiliary nozzles in a single nozzle group.

It is also possible that more than three nozzles will be used in each nozzle group. One advantage of more nozzles is that it may afford more control over the shape of the deposited line/element profile and preferably reduce TAC time.

Figure 13A:
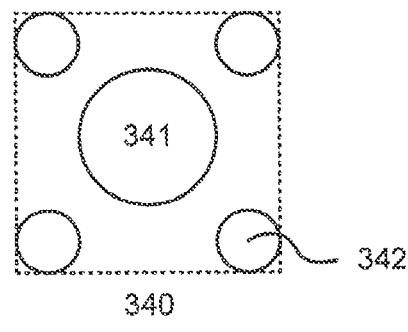
FIGS. 13A-13C show additional embodiments of exemplary multi-nozzle arrangements, including more than three nozzles, according to further aspects of the invention.
Figure 13B:
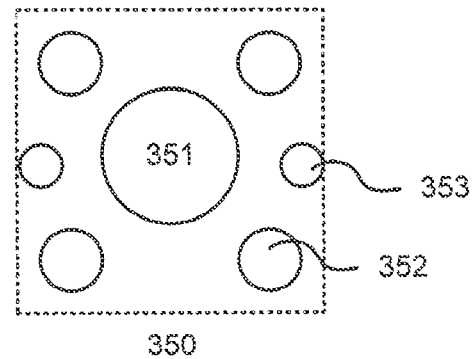
Figure 13C:
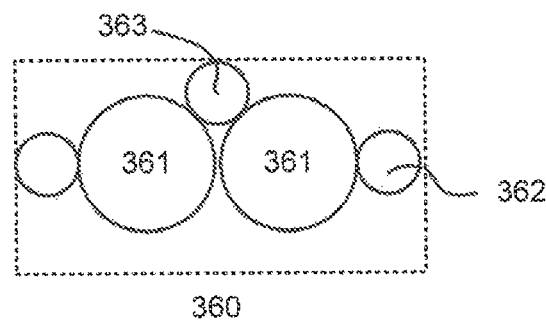

Various alternative arrangements will be understood to be broadly encompassed by the disclosure, aspects of some of which are shown in FIGS. 13A-13C. FIG. 13A shows a nozzle arrangement 340 including four nozzles 342 disposed around a central nozzle 341 in which at least one of the four nozzles 342 has a different geometry than the central nozzle 341. It is also possible that two or more of the nozzles 342 may have different geometries from one another. For example, leading nozzles may be configured to deposit a trough for nozzle 341 to fill, and trailing nozzles may be configured to further define a sharp side wall through different throttle diameters, different exhaust diameters, different cross-sectional shapes, different bore angles, different wall angles, and/or different exhaust distances from the substrate.

FIG. 13B shows a nozzle arrangement 350 including four nozzles 352 disposed around a central nozzle 351 in which at least one of the four nozzles 352 has a different geometry than the central nozzle 351. An additional set of nozzles 353 is also included which may have different geometry than both the central nozzle 351 and nozzles 352. In this example, nozzles 352 may be configured to deposit a trough for nozzle 341 to fill, and nozzles 353 may be configured to further define a sharp side wall through different throttle diameters, different exhaust diameters, different cross-sectional shapes, different bore angles, different wall angles, and/or different exhaust distances from the substrate.

FIG. 13C shows a nozzle arrangement 360 including two nozzles 362 disposed outside of two central nozzles 361, and one nozzle 363 between nozzles 361, in which at least one of the nozzles 362 or 363 has a different geometry than at least one of the central nozzles 361. It is also possible that nozzles 362 (or nozzles 361) may have different geometries from one another. Nozzle 363 may be used between nozzles 361 to even out or flatten the deposition profile. Using multiple central nozzles 361 may be advantageous, for example, in reducing the amount of overspray characteristics of the primary nozzle(s), which would otherwise have to be up to twice the diameter of nozzles 361.

Figure 15:
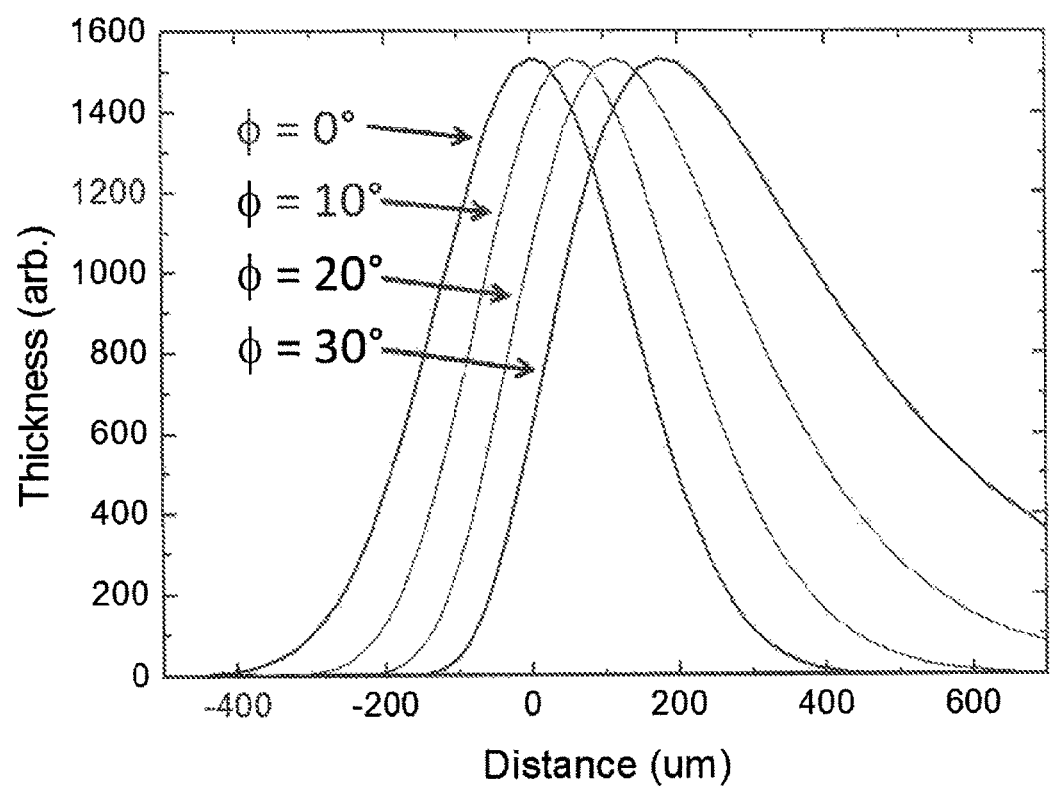
FIG. 15 shows results of a trigonometrical model showing the thickness profiles expected from nozzles at 0, 10, 20 and 30 degrees to the substrate normal, showing the peak shift and asymmetrical broadening expected to result.

In embodiments, one or more of the nozzles may be tilted with respect to another nozzle to tune the deposition pattern. This may be implemented in nozzle groups including similarly shaped and sized nozzles, or nozzle groups including nozzles with different shapes and/or sizes. The inventors have estimated the effect of nozzle tilt using a geometrical analysis. As shown in FIGS. 14A, 14B and 15, a nozzle at height h from the substrate produces vapor output over a range of angles, θ, which results in a thin film with a thickness distribution defined by some function T(x). The inventors have generally fitted T(x) to a single Gaussian function, but other functions or combinations of functions could be appropriate depending on the shape (cross section) of the nozzle and the effects of other system parameters such as pressure drop at the nozzle orifice. At any position on the substrate, θ can be calculated using the relation $\theta=\tan^{-1}(x/h)$. When the nozzle is tilted at an angle, φ, with respect to the substrate, this assumes that the distribution T(θ) does not change. This is judged to be a useful approximation, while recognizing that it may not entirely represent the exact distribution should there be interactions between the nozzle and the substrate or if the tilt of the nozzle results in a variation of h across the nozzle diameter. It is understood, nonetheless, to allow visualization of the thickness profile at various values of φ by parameterizing the thickness and distance in θ and setting a thickness of T(θ) at a position $x'=h\tan(\theta+\phi)$. The results of such a calculation for φ=0, 10, 20 and 30 degrees is shown in FIG. 15. As the tilt angle is increased, the peak of the thickness distribution moves to the right, there is a slight sharpening of the leading edge of the distribution and the distribution tail becomes substantially shallower.

There are at least two potential reasons why tilted nozzles would be advantageously used in the invention. First, it is a second way to move the peaks of the outer nozzles closer to the central peak without crowding the nozzles themselves together to the point where they would interfere with one another. Second, the resulting shape of the thickness distributions might be more appropriate for summing to a total distribution with a flat top and sharp edges. An exemplary embodiment showing two nozzles converging on a central nozzle is illustrated in FIG. 16.

Figure 16:
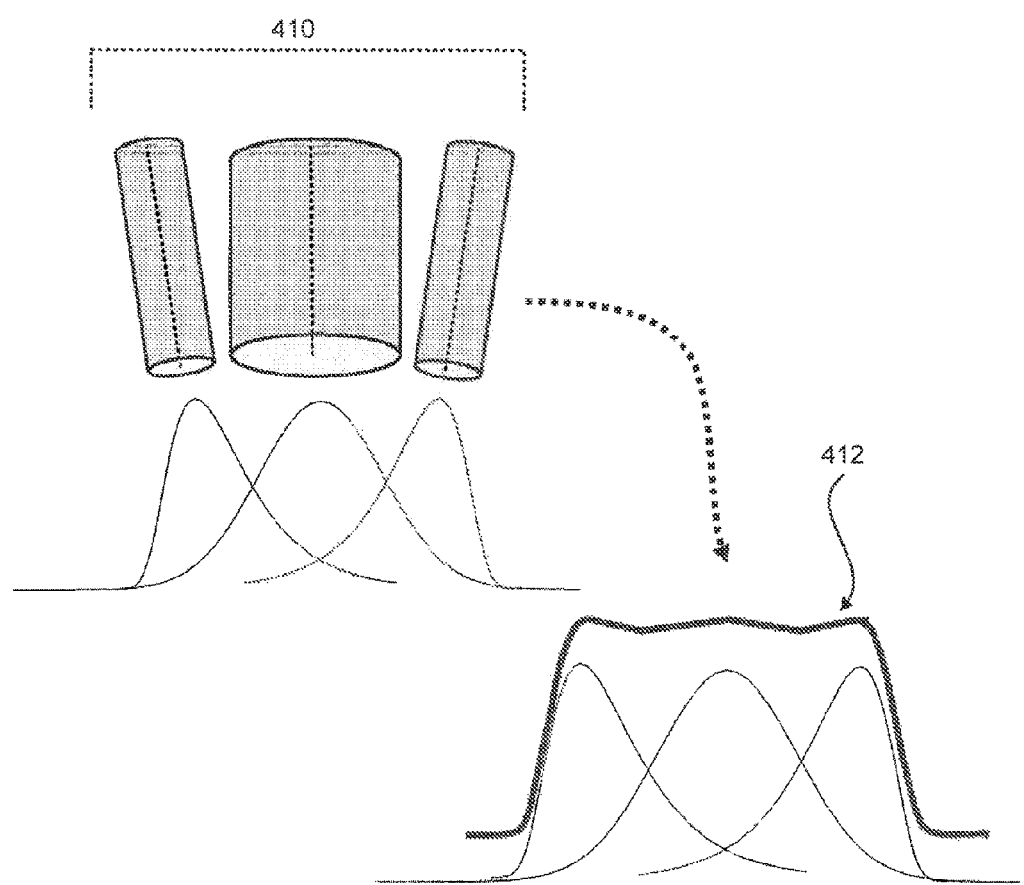
FIG. 16 is a schematic illustration showing how tilted nozzles can be used to generate a summed profile with a flat top and sharp sides.

As shown in FIG. 16, a nozzle group 410 may include a central nozzle and two or more converging nozzles, and may produce a summed distribution profile 412 with a relatively flat top and sharp edges. It should be noted that each of the nozzles shown in FIG. 16 has a different geometry in that they all have a different bore angles, as indicated by the dashed lines in each nozzle, as well as different wall angles. Additionally, the outer nozzles may include different throttle diameters, different cross-sectional shapes, and/or different exhaust diameters than the central nozzle, to tune the desired deposition profile of the outer nozzles.

In other embodiments, multiple central nozzles such as shown in FIG. 13C may be included in a nozzle group, or the central nozzle may be omitted.

Various nozzle geometries, and variations resulting in different deposition patterns, should be considered within the scope of the invention, including, for example, cylindrical nozzles as generally shown in the figures, as well as nozzles made by drilling at angles through a solid block. Nozzles might be made from stainless steel or other metals, or etched into silicon or another material amenable to etching, or formed from glass, quartz or other ceramic materials such as pyrolytic boron nitride. The distance of the nozzles above the substrate might be the same, or some might be closer to the substrate than others, but, typically, all of the nozzles of a nozzle group move together in lockstep relative to the substrate for simplicity of manufacturing. Preferably, the smaller nozzles may disposed such that the nozzle exhaust is positioned closer to the substrate than that of the larger nozzles. The carrier gas flow through each nozzle may be different in order to control the contribution of each respective nozzle to the total thickness profile. Alternatively, the same flow may be used in all the nozzles with another method used to control the contribution, such as temperature. Each individual nozzle might be cylindrical, tapered, or a converging-diverging nozzle such as a de Laval nozzle.

Figure 17:
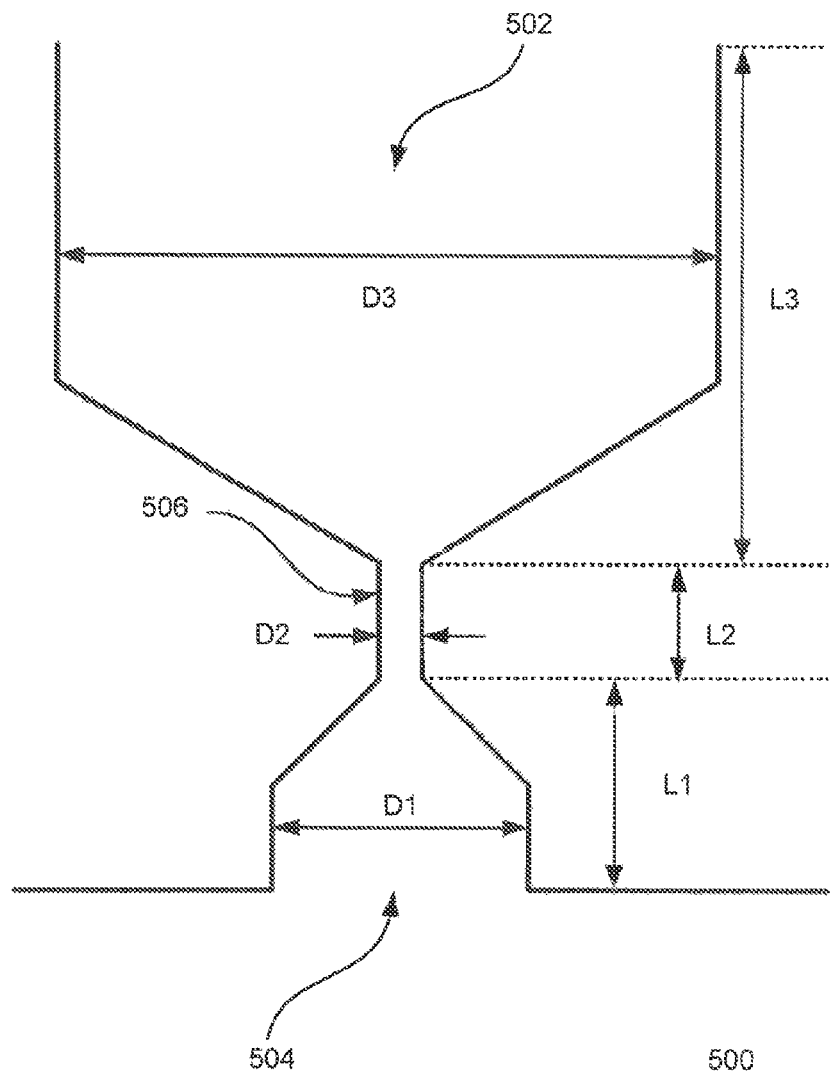
FIG. 17 is a schematic illustration showing exemplary nozzle dimensions that may be varied according to aspects of the invention.

Further details of an exemplary convergent-divergent nozzle are shown in FIG. 17, which shows an exemplary nozzle 500 may include an inlet 502, and an outlet/exhaust 504 at a distal end of the nozzle. The nozzle 500 may be included, for example, in a device configured such that a vapor mixture of a carrier gas and an organic material may be passed through the nozzle 500, and the organic material deposited on a substrate (not shown) after exiting the outlet 504.

The outlet 504 of the nozzle may include a cross sectional area A1 (not shown) and a diameter D1. The nozzle 500 may include a portion 506, which may be referred to as a "throttle," between the inlet 502 and the outlet 504 at an axial distance L1 from the outlet 504. The throttle portion 506 may include a cross sectional area A2 (not shown) and a diameter D2.

As mentioned above, a "diameter" of variously described inlets, outlets, and other nozzle portions is not limited to circular cross sections, and may be broadly understood to include a segment passing through the geometric center, or centroid, of the local cross section. In the embodiment shown in FIG. 17, D1 represents a maximum diameter of the outlet and D2 represents a minimum diameter of the portion 506. Outlet 504 may also include a radius R1 that is half of D1, and throttle portion 506 may include a radius R2 that is half of D2.

Various cross sectional shapes are possible with respect to the throttle portion 506 and outlet 504.

In embodiments, such as that shown in FIG. 17, the throttle portion 506 of the nozzle may include an axial length L2 with a substantially constant cross sectional area. L2 may be, for example, less than 1 mm, less than 5 mm, or in a range of 1 mm to 5 mm. However, it is also possible for throttle portions to include a minimal or de minimis L2, or a length with varying cross sectional areas. In such situations, L1 may be measured, for example, from the outlet to a minimum throttle cross section.

The inlet 502 may take various forms, and may include bounded areas with diameter D3 (or R3 equal to one half of D3) and/or axial length L3, or relatively unbounded areas where the diameter and/or length of the inlet tube/chamber greatly exceeds the scale of the individual throttle(s). In certain embodiments, L2/R3 may be in a range of approximately 1 to 10.

In embodiments, the outlet may include an axial length L1. In embodiments, at least part of, most of, or all of, the outlet along L1 may include a substantially constant cross sectional area. In embodiments, L1 may be, for example, greater than 1 mm, greater than 5 mm, in a range of 1 mm to 10 mm, in a range of 5 mm to 10 mm, in a range of 1 mm to 20 mm, or in a range of 5 mm to 20 mm.

Figure 18:
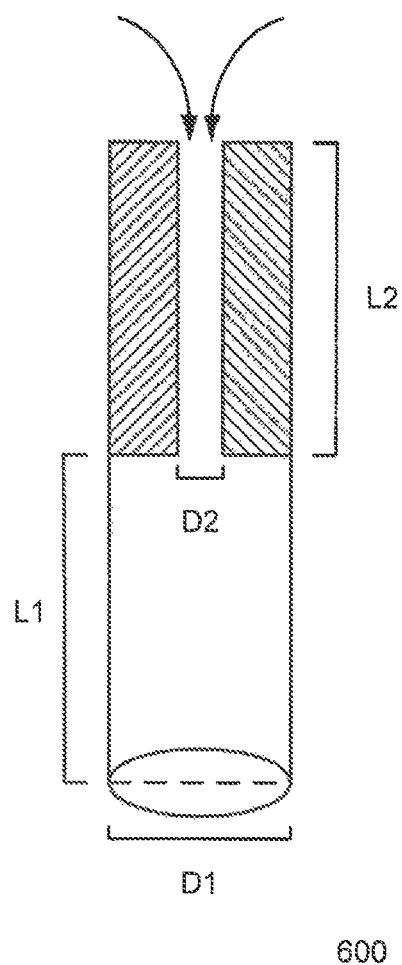
FIG. 18 is a schematic illustration showing another exemplary nozzle and dimensions that may be varied according to aspects of the invention.

A similar design is shown in FIG. 18, which depicts an outlet with a substantially uniform cross section throughout the length L1, and a relatively unbounded inlet. Such configurations may be conveniently formed, for example, by joining plates of similar or different materials, including separately formed apertures, together. FIGS. 5 and 6 show additional alternative designs.

Thus, as will be appreciated in considering FIGS. 17 and 18, and the other nozzle groups described herein, various of the dimensions shown in FIGS. 17 and 18 may be adjusted to obtain nozzles with different geometries, such as varying one or more of A1, A2, A3, D1, D2, D3, L1, L2 and/or L3. In addition, bore angles, sidewall angles and/or transition angles between the inlet 502, throttle 506 and/or outlet 504.

Experimental verification has been provided based on depositing and measuring lines of thin film from a 1.0 mm nozzle and a 340 µm nozzle, and verifying that the line width and sharpness varies as shown in FIG. 8. The compound line shapes are subsequently based on models of linear superposition and trigonometrical models of tilted nozzles. However, it should be noted that the invention is not be limited to the specific models used.

As mentioned previously, aspects of the present invention may find particular relevance in the field of OVJP deposition of organic emitting and/or detecting devices. Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

An OLED may include, for example, a substrate, an anode, a hole injection layer, a hole transport layer, an electron blocking layer, an emissive layer, a hole blocking layer, an electron transport layer, an electron injection layer, a protective layer, and a cathode. Such OLEDs may be fabricated by depositing the layers described, in order. The properties and functions of these various layers, as well as example materials, are described in more detail in U.S. Pat. No. 7,279,704 at cols. 6-10, which are incorporated by reference.

Figure 19:
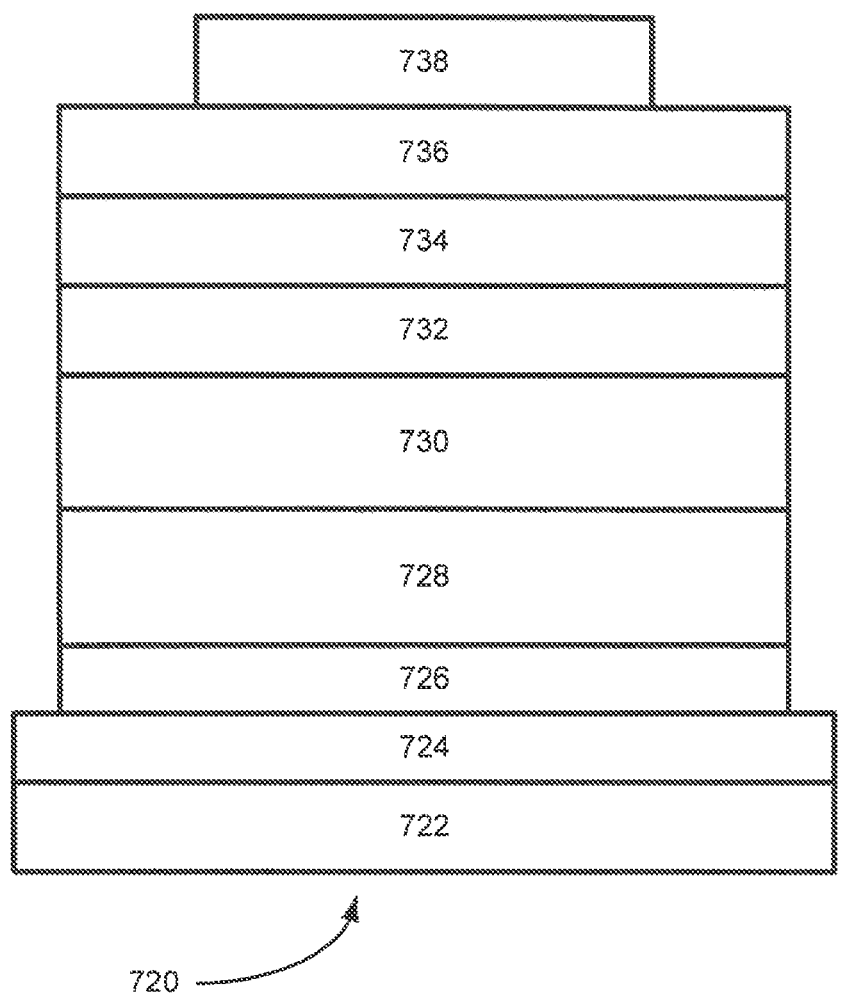
FIG. 19 is a schematic of an exemplary organic light emitting stack, which may be formed, at least in part, according to aspects of the invention.

According to embodiments, lighting panels, displays and/or detectors may be provided with an OLED stack. As shown in FIG. 19, an exemplary OLED device stack 720 may include a plurality of material layers 722-736. OLEDs may be fabricated on a glass substrate 722, and include, in order, an anode 724 (1200 Å thick ITO), a hole injection layer 726 (100 Å thick LG101, available from LG Chemicals of Korea), a hole transport layer 728 (450 Å thick NPD), a first emissive layer 730 (200 Å thick Host B doped with 30% Green Dopant A and 0.6% Red Dopant A), a second emissive layer 732 (75 Å thick Blue Host A doped with 25% Blue Dopant A), a blocking layer 734 (50 Å thick Blue Host A), a layer 736 (250 Å thick layer of 40% LG201, available from LG Chemicals of Korea and 60% LiQ), and a cathode 738 (10 Å thick layer of LiQ (lithium quinolate) and a 1000 Å thick layer of Al). The foregoing materials and dimensions are provided merely by way of example, and should not be interpreted as limiting the scope of the invention. Other configurations for the OLED are also contemplated and will be appreciated by those of skill in the art.

Some examples of the OLED materials that may be used to form the device stack 720 are shown below.

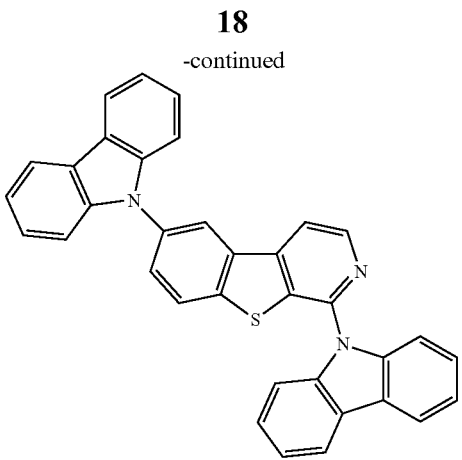

Host B

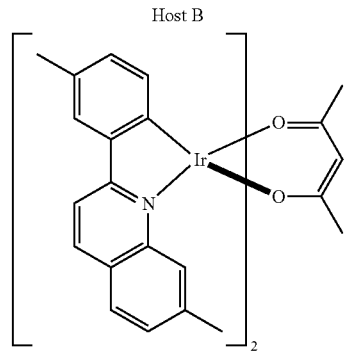

Red Dopant A

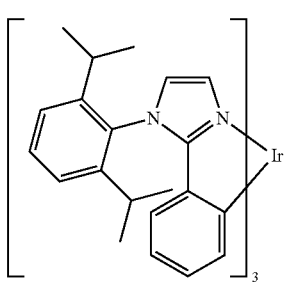

Blue Dopant A

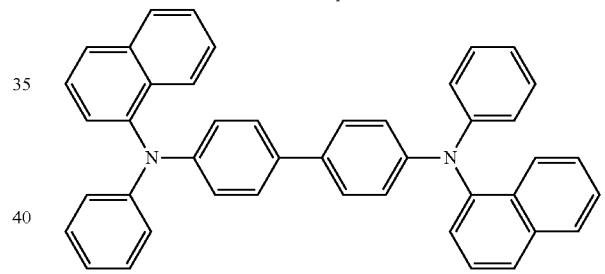

NPD

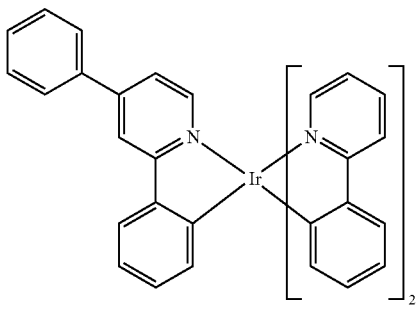

Green Dopant A

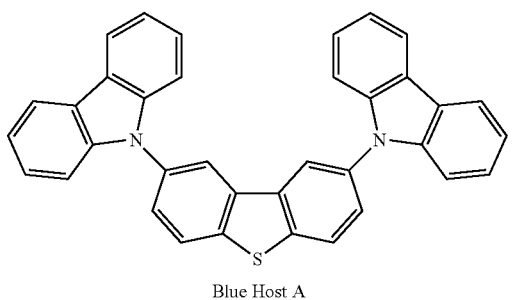

Blue Host A

An OLED device, such as shown in FIG. 19, may be incorporated in an OLED panel or, on a smaller scale, in an OLED display.

According to aspects of the invention, it may be desirable to deposit one or more of the organic layers using the techniques described herein in order to obtain a patterned layer including one or more strips of deposited material, such as when the nozzle and/or the substrate are moved relative to one another. As mentioned previously, a plurality of nozzles may be used, each nozzle depositing a different organic material, to form multiple strips of different organic emitters.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

The simple layered structure discussed above is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, a hole transport layer may transport holes and inject holes into emissive layer, and may be described as a hole transport layer or a hole injection layer. In embodiments, an OLED may be described as having an "organic layer" disposed between a cathode and an anode. This organic layer may comprise a single layer, or may further comprise multiple layers of different organic materials.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIG. 19. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. Nos. 7,431,968 and 7,744,957, which are incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A method of depositing a thin film on a substrate comprising:
    ejecting a carrier gas and a material from a plurality of nozzles while moving the nozzles or the substrate relative to one another,
    wherein the material is deposited on the substrate from at least two of the nozzles, the at least two of the nozzles including different geometries;
    wherein the at least two nozzles include two or more relatively small nozzles and a relatively large nozzle, the relatively small nozzles being disposed adjacent to the relatively large nozzle; and
    wherein the two or more relatively small nozzles are disclosed on opposite sides of the relatively large nozzle.

2. The method of claim 1, wherein the different geometries include at least one of different throttle diameters, different exhaust diameters, different cross-sectional shapes, different bore angles, different wall angles, different exhaust distances from the substrate, and different leading edges relative to the direction of movement of the nozzles or the substrate.

3. The method of claim 1, wherein the relatively small nozzles are angled to converge with respect to the relatively large nozzle.

4. The method of claim 1, wherein the relatively small nozzles are disposed closer to the substrate than the relatively large nozzle.

5. The method of claim 1, wherein the relatively small nozzles are disposed further from the substrate than the relatively large nozzle.

6. The method of claim 1, wherein said exhaust distances of the at least two nozzles from the substrate are approximately 300A different; or more.

7. The method of claim 1, wherein the at least two of the nozzles include a staggered arrangement relative to the direction of travel of the nozzles or substrate.

8. The method of claim 1, wherein the relatively small nozzles and the relatively large nozzle are disposed in an arrangement that is not perpendicular or parallel to the direction of travel of the nozzles or substrate.

9. The method of claim 1, wherein the material is deposited by the at least two of the nozzles in an at least partially overlapping pattern.

10. The method of claim 1, wherein the thin film is deposited in a pattern including a plurality of laterally spaced elements, each of the elements deposited by a separate group of nozzles of the plurality of nozzles.

11. The method of claim 1, wherein depositing the material from the at least two of the nozzles provides a sharper edge pattern than would be achieved by depositing the pattern with a single nozzle.

12. An apparatus for depositing a thin film of material on a substrate, comprising:
    a plurality of nozzles in fluid communication with a carrier has and a material to be deposited; and
    a translation mechanism configured to move at least one of the substrate and the plurality of nozzles, relative to one another, during a deposition process,
    wherein, at least two of the nozzles include different geometries;
    wherein the at least two nozzles include two or more relatively small nozzles and a relatively large nozzle, the relatively small nozzles being disposed adjacent to the relatively large nozzle; and
    wherein the two or more relatively small nozzles are disposed on opposite sides of the relatively large nozzle.

13. The apparatus of claim 12, wherein the different geometries include at least one of different throttle diameters, different exhaust diameters, different cross-sectional shapes, different bore angles, different wall angles, different exhaust distances from the substrate, and different leading edges relative to the direction of movement of the nozzles or the substrate.

14. The apparatus of claim 12, wherein the relatively small nozzles are angled to converge with respect to the relatively large nozzle.

15. The apparatus of claim 12, wherein the relatively small nozzles are disposed closer to the substrate than the relatively large nozzle.

16. The apparatus of claim 12, wherein said exhaust distances of the at least two nozzles from the substrate are approximately 300A different, or more.

17. The apparatus of claim 12, wherein the at least two of the nozzles include a staggered arrangement relative to the direction of travel of the nozzles or substrate.

18. The apparatus of claim 12, wherein the relatively small nozzles and the relatively large nozzle are disposed in an arrangement that is not perpendicular or parallel to the direction of travel of the nozzles or substrate.

19. The apparatus of claim 12, wherein the at least two of the nozzles are arranged such that the material is deposited from the at least two of the nozzles in an at least partially overtapping pattern.

20. The apparatus of claim 12, wherein the apparatus is configured such that the thin film is deposited in a pattern including a plurality of laterally spaced elements, each of the elements deposited by a separate group of nozzles of the plurality of nozzles.

* * * * *